(12) United States Patent
Yoon et al.

(10) Patent No.: US 7,889,594 B2
(45) Date of Patent: Feb. 15, 2011

(54) SEMICONDUCTOR MEMORY DEVICE

(75) Inventors: Sang-Sic Yoon, Gyeonggi-do (KR); Kyung-Hoon Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 125 days.

(21) Appl. No.: 12/327,312

(22) Filed: Dec. 3, 2008

(65) Prior Publication Data

US 2010/0054059 A1 Mar. 4, 2010

(30) Foreign Application Priority Data

Sep. 2, 2008 (KR) ...................... 10-2008-0086272

(51) Int. Cl.
*G11C 11/00* (2006.01)
(52) U.S. Cl. ................................ 365/233.1; 365/189.05
(58) Field of Classification Search .............. 365/233.1, 365/189.05
See application file for complete search history.

(56) References Cited

U.S. PATENT DOCUMENTS

| | | | |
|---|---|---|---|
| 6,788,154 B2 | 9/2004 | Maneatis | |
| 7,336,755 B1 * | 2/2008 | Tetzlaff | 375/376 |
| 2002/0005858 A1 * | 1/2002 | Aoki | 345/618 |
| 2006/0097762 A1 * | 5/2006 | Jeon | 327/156 |
| 2007/0229326 A1 | 10/2007 | Le-Gall | |

FOREIGN PATENT DOCUMENTS

| | | |
|---|---|---|
| JP | 2006050102 A | 2/2006 |
| KR | 10-2007-0027071 | 3/2007 |
| KR | 10-0763849 | 9/2007 |
| KR | 1020090023815 A | 3/2009 |

OTHER PUBLICATIONS

Notice of Allowance issued from Korean Intellectual Property Office on Dec. 28, 2009.

\* cited by examiner

*Primary Examiner*—Michael T Tran
(74) *Attorney, Agent, or Firm*—IP & T Group LLP

(57) ABSTRACT

A circuit which can reduce time taken by a clock alignment training operation in a semiconductor memory device is provided. The semiconductor memory device, which includes: a clock inputting unit configured to receive a system clock and a data clock; a clock dividing unit configured to divide a frequency of the data clock to generate a data division clock, wherein the clock dividing unit determines a phase of the data division clock in response to an inversion division control signal; a phase dividing unit configured to generate a plurality of multiple phase data division clocks having respective predetermined phase differences in response to the data division clock; a data serializing unit configured to serialize predetermined parallel pattern data in correspondence with the multiple phase data division clocks; and a signal transmitting unit configured to transmit an output signal of the data serializing unit to the outside.

32 Claims, 5 Drawing Sheets

SEMICONDUCTOR MEMORY DEVICE

CROSS-REFERENCE TO RELATED APPLICATIONS

This application claims priority to Korean patent application number 10-2008-0086272, filed on Sep. 2, 2008, which is incorporated by reference in its entirety.

BACKGROUND OF THE INVENTION

The present subject matter relates to a clock alignment training operation which is required in a high-speed semiconductor memory device, and more particularly, to a circuit which can reduce time taken for a clock alignment training operation in a semiconductor memory device.

In a system including a plurality of semiconductor memory devices, the semiconductor memory devices are used for storing data. When a data processor such as a memory control unit (MCU) requests data, the semiconductor memory device outputs data corresponding to an address input from the data processor requesting data, or stores data provided from the corresponding data processor in a position corresponding to the address.

To this end, a high-speed memory device, which is developed recently, is designed to input/output two data between a rising edge and a falling edge of an external system clock and to input/output two data between the falling edge and a next rising edge of the external system clock. In short, the high-speed memory device is designed to input/output four data in one cycle of a system clock.

However, since the system clock is merely represented as two states, i.e., logic high or logic low, a data clock having two times higher frequency than that of the system clock is required for inputting/outputting four data in one cycle. That is, a dedicated clock for input/output of data is essentially required.

Accordingly, when an address and a command are received/transmitted, the high-speed semiconductor memory device uses the system clock as a reference clock. When data are input/output, the high-speed semiconductor memory device performs control in order for the data clock to have frequency two times higher than that of the system clock using the data clock as the reference clock.

That is, the high-speed semiconductor memory device repeats two cycles of the data clock for one cycle of the system clock, and inputs/outputs data at a rising edge and falling edge of the data clock respectively. Therefore, the high-speed semiconductor memory device can input/output four data for one cycle of the system clock.

In this way, the high-speed semiconductor memory device exchanges data using two clocks having different frequencies for performing a read or write operation, as opposed to a conventional Double Data Rate (DDR) synchronous memory device which uses one system clock as a reference clock for performing a read or write operation.

However, when a phase of the system clock and a phase of the data clock are not aligned, a reference for transfer of an operation command and an address and a reference for transfer of data are not aligned. This signifies that the high-speed semiconductor memory device cannot normally operate.

Therefore, to normally operate the high-speed semiconductor memory device, an interface training operation between the high-speed semiconductor memory device and a data process device must be performed at an initial operation.

Herein, the interface training means that an interface for transferring commands, addresses and data is trained in order to operate at an optimal time before a normal operation between the semiconductor memory device and the data process device is performed.

The interface training is divided into clock alignment training (WCK2CK training), read training, and write training. In the clock alignment training (WCK2CK training), the data clock and the system clock are aligned.

FIG. 1 is a block diagram of a circuit performing the clock alignment training in accordance with a conventional technology.

First, in the basic principle of the clock alignment training, the high-speed semiconductor memory device receives an address signal and a command signal from an external controller on the basis of the system clock HCK, and outputs data stored in the semiconductor memory device to the external controller on the basis of the data clock WCK as described above.

Accordingly, when there is a phase difference between the system clock HCK and the data clock WCK, the data stored in the semiconductor memory device reach the external controller more quickly or more slowly by a time corresponding to the phase difference.

Consequently, the clock alignment training is an operation in which the high-speed semiconductor memory device detects a phase difference between the data clock WCK and the system clock HCK applied from the external controller at an initial operation and transmits the detection result to the external controller, and thus reduces the phase difference between the system clock HCK and the data clock WCK.

That is, in the circuit for performing the clock alignment training in accordance with the conventional technology illustrated in FIG. 1, the circuit receives a data clock OUT_WCK and a system clock OUT_HCK from the external controller, buffers the data clock OUT_WCK and the system clock OUT_HCK to output a buffered data clock WCK and a buffered system clock HCK, detects the phase difference between the data clock WCK and the system clock HCK, and transmits the detection result to the external controller.

Referring to FIG. 1, the circuit includes a clock inputting unit 100 receiving the system clock OUT_HCK for synchronizing an input time of the address signal and an input time of the command signal and the data clock OUT_WCK, which a has higher frequency than that of the system clock OUT_HCK, for synchronizing an input time of the data signal from the external controller, and outputs the buffered system clock HCK and the buffered data clock WCK. The circuit further includes a clock dividing unit 120 dividing a frequency of the data clock WCK to generate a data division clock DIV_WCK in order for the data division clock DIV_WCK to have the same frequency as that of the system clock HCK, a phase detecting unit 140 detecting a phase difference between the system clock HCK and the data division clock DIV_WCK and generating a detection signal DET_SIG corresponding to the detection result, and a signal transmitting unit 160 transmitting the detection signal DET_SIG as a training information signal TRAINING_INFO_SIG to the external controller.

FIG. 2 is a timing diagram illustrating an operation waveform of the conventional circuit of FIG. 1 performing the clock alignment training.

Referring to FIG. 2, although a frequency of the data clock WCK, which is input to the circuit for performing the clock alignment training in accordance with the conventional technology from the external controller, is higher than that of the system clock HCK, it can be seen that a frequency of the data division clock DIV_WCK output from the clock dividing unit 120 is the same as that of the system clock HCK because the clock dividing unit 120 changes a frequency of the data clock WCK in order for the frequency of the data clock WCK to be the same as that of the system clock HCK.

Moreover, referring to FIG. 2, clock edges are not synchronized with one another at the moment ①before the performing of the clock alignment training operation. That is, the phase of the data clock WCK and the phase of the data division clock DIV_WCK are not synchronized with the phase of the system clock HCK at the moment ①before the performing of the clock alignment training operation.

Still referring to FIG. 2, the circuit changes the phase of the data clock WCK and the phase of the data division clock DIV_WCK in a state where the phase of the system clock HCK is constant in order to synchronize the phase of the data clock WCK and the phase of the data division clock DIV_WCK with the phase of the system clock HCK at moments ②, ③, ④, ⑤ and ⑥ after the starting of the clock alignment training operation.

At this point, the phase of the data clock WCK and the phase of the data division clock DIV_WCK are changed according to a logic level of the training information signal DET_SIG (TRAINING_INFO_SIG) transmitted to the external controller by the signal transmitting unit 160. That is, since the logic level of the training information signal DET_SIG (TRAINING_INFO_SIG) is continuously a logic low state, the external controller gradually changes the phase of the data clock WCK and the phase of the data division clock DIV_WCK and applies the data clock WCK and the data division clock DIV_WCK to the circuit for performing the clock alignment training.

Then, at the moment ⑥ when the phase of the data clock WCK and the phase of the data division clock DIV_WCK are synchronized with the phase of the system clock HCK, the logic level of the training information signal DET_SIG (TRAINING_INFO_SIG) is changed from a logic low state into a logic high state. In a section ⑦ when the logic level of the training information signal DET_SIG (TRAINING_INFO_SIG) is continuously maintained as the logic high, the phases of the data clock WCK and the data division clock DIV_WCK are no longer changed. That is, since there is a state where the logic level of the training information signal DET_SIG (TRAINING_INFO_SIG) is changed into the logic high, the external controller makes the phase of the data clock WCK and the phase of the data division clock DIV_WCK constant and applies the data clock WCK and the data division clock DIV_WCK to the circuit for performing the clock alignment training.

As a result, it can be seen that the circuit for performing the clock alignment training continuously compares the phase of the data clock WCK with the phase of the system clock HCK through the phase detecting unit 140 and transfers the comparison result, i.e., the training information signal DET_SIG (TRAINING_INFO_SIG) to the external controller until the phases of the data clock WCK and the data division clock DIV_WCK input from the external controller are synchronized with the phase of the system clock HCK through the clock alignment training operation.

The reason why the circuit for performing the clock alignment training is included in a semiconductor memory device is to synchronize the phase of the data clock WCK with the phase of the system clock HCK by performing the clock alignment training operation at a power supply time when a power supply voltage is firstly applied to the semiconductor memory device, i.e., a power up time.

However, the circuit must synchronize the phase of the data clock WCK with the system clock HCK by performing the clock alignment training operation even at an exit time when it exits from an operation mode such as a power down mode for supporting the reduction of the power consumption of the semiconductor memory device. The reason for sychoronization of the data clock WCK with the system clock HCK via the clock alignment training operation is as follows. In a state where the circuit enters an operation mode such as the power down mode, since data are not input/output in the semiconductor memory device, only the system clock HCK is input to the semiconductor memory device and the data clock WCK is not input to the semiconductor memory device. Thus, the phase of the data clock WCK may not be synchronized with the phase of the system clock HCK due to the change of the phase of the data clock WCK in a case that the circuit exits from the operation mode like the power down mode and the data clock WCK is again input to the semiconductor memory device.

At this point, in an entry/exit process of the operation mode such as the power down mode, since a jitter component occurs in the data clock WCK due to noise, the phase of the data clock WCK may be changed. However, the probability of occurrence of the phase change is very low, and very short time is taken for synchronizing the phase of the data clock WCK with the phase of the system clock HCK through the clock alignment training operation even though the phase change occurs. Accordingly, the phase change of the data clock WCK cannot exert influence on the total operations of the semiconductor memory device.

Above all, among the elements of the circuit for performing the clock alignment training operation of FIG. 1, the clock dividing unit 120 is turned on/off and a clock division time is changed in an entry/exit process of the operation mode such as the power down mode, and thus the phase of the data clock WCK can be inverted. In a case that the phase inversion occurs, since the phase of the data clock WCK must be changed by more than ½tCK for again synchronizing the phase of the data clock WCK with the phase of the system clock HCK through the clock alignment training operation, it takes very long time for the phase change, and, consequently, the total operations of the semiconductor memory device can largely be delayed.

These problems can be serious as the frequency of the system clock HCK and the frequency of the data clock WCK decrease.

SUMMARY OF THE INVENTION

Embodiments of the present subject matter are directed to provide a semiconductor memory device, which determines a phase difference between a system clock HCK and a data clock WCK using predetermined pattern data which are synchronized with the data clock WCK to multiple phases upon clock alignment training operation, thereby reducing time taken for the clock alignment training operation in the semiconductor memory device.

In accordance with an aspect of the disclosure, there is provided a semiconductor memory device, which includes: a clock inputting unit configured to receive a system clock and a data clock; a clock dividing unit configured to divide a frequency of the data clock to generate a data division clock, wherein the clock dividing unit determines a phase of the data division clock according to an inversion division control signal; a phase dividing unit configured to generate a plurality of multiple phase data division clocks having respective predetermined phase differences according to the data division clock; a data serializing unit configured to serialize predetermined parallel pattern data in correspondence with the multiple phase data division clocks; and a signal transmitting unit configured to transmit an output signal of the data serializing unit to the outside. The semiconductor memory device further includes: a data inputting/outputting unit configured to output internal data to the outside or receive external data according to the data clock; and a reset unit configured to reset the data inputting/outputting unit according to the inversion division control signal. The clock inputting unit includes: a system clock generator configured to receive a first external clock for synchronizing an input time of an address signal and an input time of a command signal, and output the received first external clock as the system clock; and a data clock generator configured to receive a second external clock for synchronizing an input time of a data signal, and output the received second external clock as the data clock.

In accordance with an aspect of the disclosure, there is provided a semiconductor memory device, which includes: a clock inputting unit configured to receive a system clock and a data clock; a clock dividing unit configured to divide a frequency of the data clock to generate a data division clock, wherein the clock dividing unit determines a phase of the data division clock according to an inversion division control signal; a phase detecting unit configured to detect a phase difference between the data division clock and the system clock, and generate a detection signal corresponding to a result of the detection; a phase dividing unit configured to generate a plurality of multiple phase data division clocks having respective predetermined phase differences according to the data division clock; a data serializing unit configured to serialize predetermined parallel pattern data in correspondence with the multiple phase data division clocks; and a signal transmitting unit configured to selectively transmit an output signal of the data serializing unit or the detection signal to the outside according to a training operation mode signal. The semiconductor memory device further includes: a data inputting/outputting unit configured to output internal data to the outside or receive external data according to the data clock; and a reset unit configured to reset the data inputting/outputting unit according to the inversion division control signal or the training operation mode signal. The clock inputting unit includes: a system clock generator configured to receive a first external clock for synchronizing an input time of an address signal and an input time of a command signal, and output the received first external clock as the system clock; and a data clock generator configured to receive a second external clock for synchronizing an input time of a data signal, and output the received second external clock as the data clock.

In accordance with an aspect of the disclosure, there is provided an operation method of a semiconductor memory device, the operation method including: receiving a system clock and a data clock; dividing a frequency of the data clock to generate a data division clock, wherein a phase of the data division clock is determined according to an inversion division control signal; sensing an entry of a normal training mode or an entry of an auto training mode; generating a plurality of multiple phase data division clocks having respective predetermined phase differences according to the data division clock when the auto training mode is entered as a result of the sense; serializing predetermined parallel pattern data in correspondence with the respective multiple phase data division clocks; and transmitting the serialized pattern data to the outside. The operation method further includes: outputting internal data to the outside or receiving external data according to the data clock, wherein a phase of the data clock is initialized at an exit time of the normal training mode; and outputting the external data to the outside or receiving the internal data according to the data clock, wherein the phase of the data clock is initialized at a time when the inversion division control signal is shifted in an operation section of the auto training mode. The receiving of the system clock and the data clock includes: receiving a first external clock for synchronizing an input time of an address signal and an input time of a command signal, and output the received first external clock as the system clock; and receiving a second external clock for synchronizing an input time of a data signal, and outputting the received second external clock as the data clock.

DESCRIPTION OF SPECIFIC EMBODIMENTS

Other objects and advantages of the present subject matter can be understood by the following description, and become apparent with reference to the embodiments of the present subject matter. The present invention may, however, be embodied in different forms and should not be construed as limited to the embodiments set forth herein. Rather, these embodiments are provided so that this disclosure will be thorough and complete, and will fully convey the scope of the present subject matter to those skilled in the art.

Figure 1:
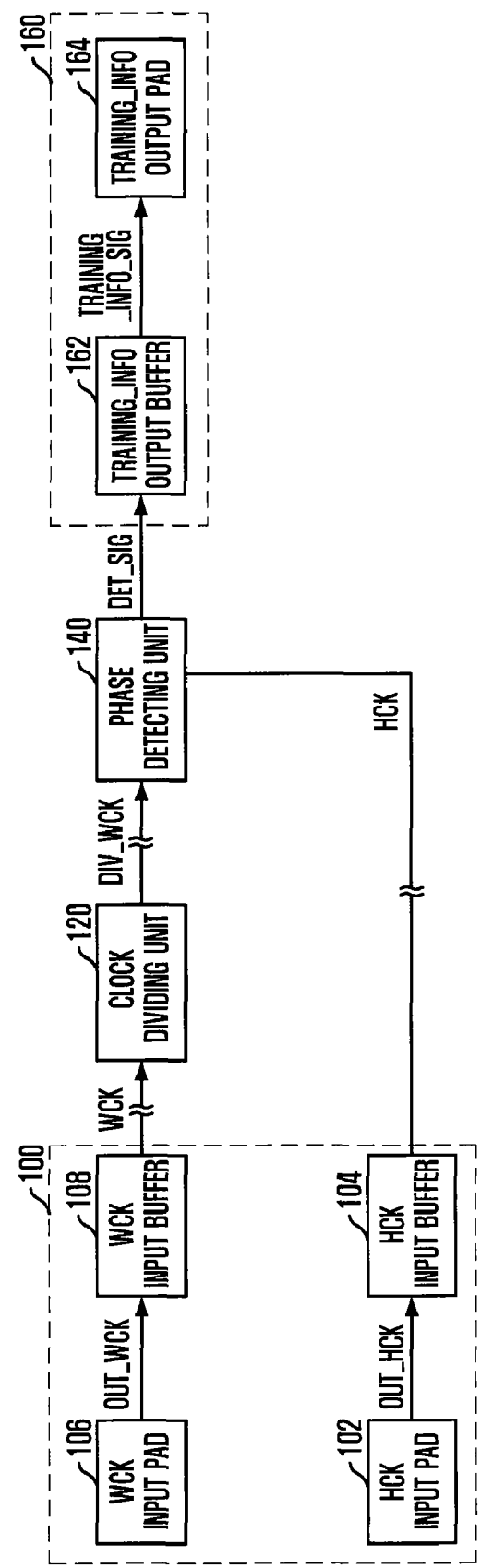
FIG. 1 is a block diagram of a conventional circuit for performing clock alignment training.
Figure 2:
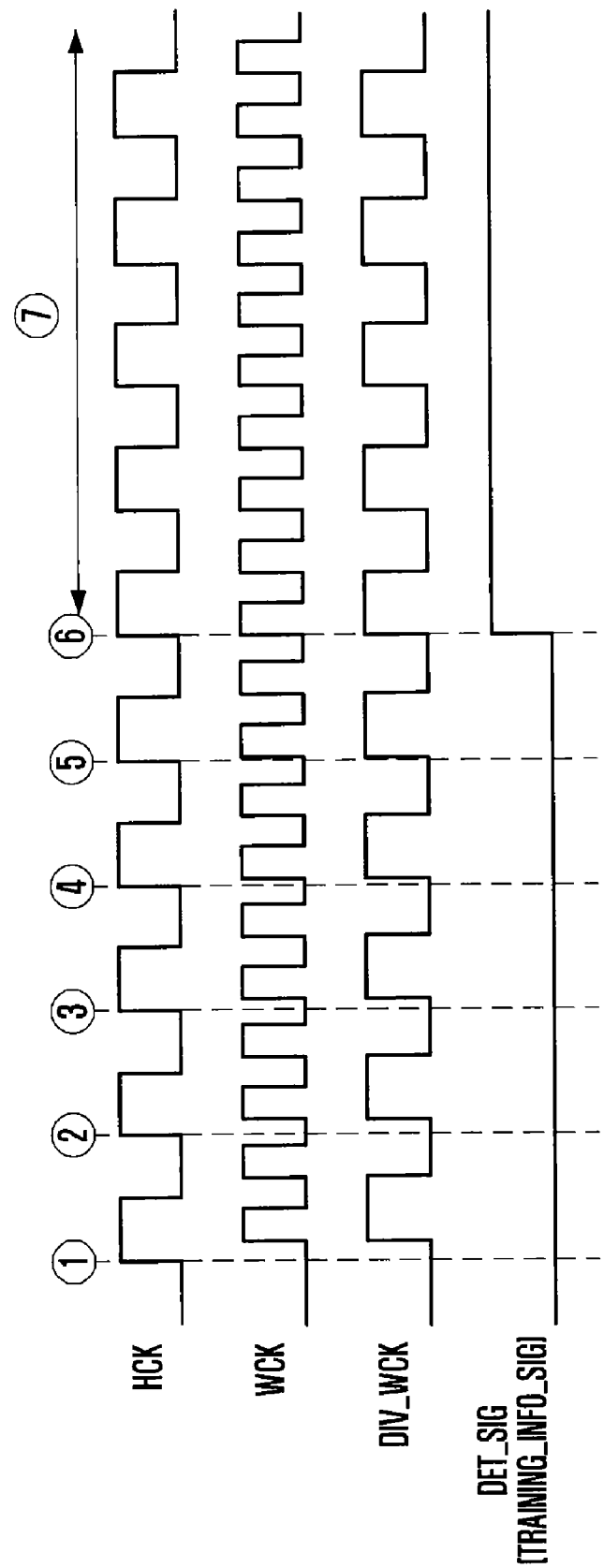
FIG. 2 is a timing diagram illustrating an operation waveform of the circuit of FIG. 1 performing the clock alignment training.
Figure 3:
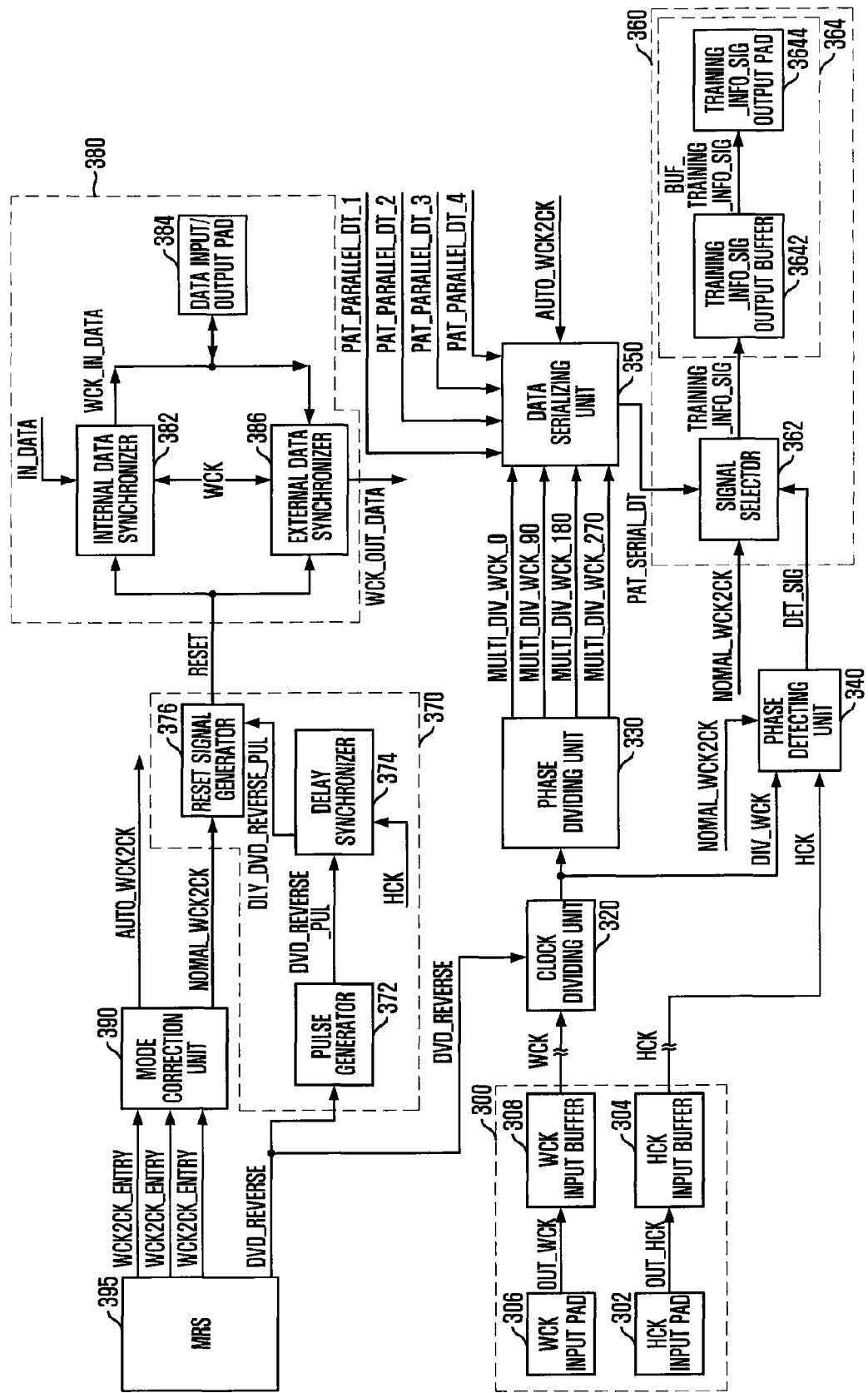
FIG. 3 is a block diagram of a circuit for performing clock alignment training in accordance with an embodiment of the present subject matter.

FIG. 3 is a block diagram of a circuit for performing clock alignment training in accordance with an embodiment of the present subject matter.

Referring to FIG. 3, the circuit for performing the clock alignment training in accordance with an embodiment of the present subject matter includes a clock inputting unit 300 receiving the system clock OUT_HCK for synchronizing an address signal and a command signal and a data clock OUT_WCK, which has higher frequency than that of the system clock HCK, for synchronizing a data signal from the external controller to output a buffered system clock HCK and a buffered data clock WCK, a clock dividing unit 320 dividing a frequency of the data clock WCK to generate a data division clock DIV_WCK having the same frequency as that of the system clock HCK. Herein, the clock dividing unit 320 selectively inverts the phase of the data division clock DIV_WCK according to an inversion division control signal DVD_REVERSE, a phase detecting unit 340 detecting a phase difference between the system clock HCK and the data division clock DIV_WCK and generating a detection signal DET_SIG corresponding to the detection result, a phase dividing unit 330 generating a plurality of multiple phase data division clocks MULTI_DIV_WCK_0, MULTI_DIV_WCK_90, MULTI_DIV_WCK_180 and MULTI_DIV_WCK_270 having the predetermined magnitudes of respective phase differences in response to the data division clock DIV_WCK, a data serializing unit 350 serializing predetermined parallel pattern data PAT_PARALLEL_DT_1 to PAT_PARALLEL_DT_4 in correspondence with the multiple phase data division clocks MULTI_DIV_WCK_0, MULTI_DIV_WCK_90, MULTI_DIV_WCK_180 and MULTI_DIV_WCK_270, and a signal transmitting unit 360 selectively transmitting the detection signal DET_SIG and the output signal PAT_SERIAL_DT of the data serializing unit 350 to the outside according to a training operation mode signal NORMAL_WCK2CK. Moreover, the circuit further includes a data inputting/outputting unit 380 outputting internal data IN_DATA to the outside and receiving external data OUT_DATA according to the data clock WCK, and a reset unit 370 resetting the data inputting/outputting unit 380 in response to the inversion division control signal DVD_REVERSE or the training operation mode signal NORMAL_WCK2CK.

Moreover, the circuit further includes a mode controlling unit 380 generating the training operation mode signal NORMAL_WCK2CK for controlling the operation of a normal training mode NORMAL_WCK2CK MODE and the auto training operation mode signal AUTO_WCK2CK for controlling the operation of an auto training mode AUTO_WCK2CK MODE, in response to a clock alignment training operation entry signal WCK2CK_ENTRY for controlling the entry/exit of the clock alignment training operation, a clock alignment training operation exit signal WCK2CK_EXIT and an auto sync operation entry signal AUTOSYNC_ENTRY for controlling which clock alignment training operation is performed in the operation section of clock alignment training. Herein, the clock alignment training operation entry signal WCK2CK_ENTRY and the clock alignment training operation exit signal WCK2CK_EXIT are predefined and preset in a Mode Register Set (MRS) 395.

The signal transmitting unit 360 includes a signal selector 362 outputting any one of the detection signal DET_SIG and the output signal PAT_SERIAL_DT of the data serializing unit 350 as a training information signal TRAINING_INFO_SIG in response to the training operation mode signal NORMAL_WCK2CK, and a training information signal transmitter 364 transmitting the training information signal TRAINING_INFO_SIG to an external controller.

Moreover, the training information signal transmitter 364 of the signal transmitting unit 360 includes a training information signal output buffer 3642 buffering the training information signal TRAINING_INFO_SIG and outputting the buffered signal BUF_TRAINING_INFO_SIG, and a training information signal output pad 3644 transmitting the training information signal BUF_TRAINING_INFO_SIG buffered by the training information signal output buffer 3642 to the external controller.

The reset unit 370 includes a pulse generator 372 generating an inversion division control pulse DVD_REVERESE_PUL which is toggled at a time when the logic level of the inversion division control signal DVD_REVERSE is shifted, a delay synchronizer 374 delaying the inversion division control pulse DVD_REVERSE_PUL by a predetermined time and outputting the delayed pulse DLY_DVD_REVERSE_PUL, and a reset signal generator 376 generating a reset signal RESET in response to the training operation mode signal NORMAL_WCK2CK or the output pulse DLY_DVD_REVERSE_PUL of the delay synchronizer 374. The delay synchronizer 374 synchronizes the division control pulse DVD_REVERSE_PUL with the system clock HCK and outputs the delayed pulse DLY_DVD_REVERSE_PUL.

The clock inputting unit 300 includes a system clock input pad 302 receiving a system clock OUT_HCK applied from the external controller, a system clock input buffer 304 buffering the system clock OUT_HCK transferred through the system clock input pad 302 and outputting the buffered system clock HCK, a data clock input pad 306 receiving a data clock OUT_WCK applied from the external controller, wherein the data clock OUT_WCK has higher frequency than that of the system clock OUT_HCK HCK applied from the external controller, and a data clock buffer 308 buffering the data clock OUT_WCK transferred through the data clock input pad 306 and outputting the buffered data clock WCK.

The data inputting/outputting unit 380 includes an internal data synchronizer 382 synchronizing internal data IN_DATA on the basis of the data clock WCK to output them as a synchronization internal data WCK_IN_DATA, a data input/output pad 384 outputting the synchronization internal data WCK_IN_DATA to the outside and receiving the external data OUT_DATA, and an external data synchronizer 386 synchronizing the external data OUT_DATA on the basis of the data clock WCK to receive them as a synchronization external data WCK_OUT_DATA.

The operations of the respective elements of the circuit for performing the clock alignment training will be described below.

First, since the frequency of the data clock WCK is higher than the frequency of the system clock HCK, the clock dividing unit 320 divides the frequency of the data clock WCK at a suitable level, and allows the data division clock DIV_WCK which is generated according to a result of the division to have the same frequency as that of the system clock HCK.

At this point, when the inversion division control signal DVD_REVERSE is activated to a logic high, the clock dividing unit 320 inverts the phase of the data division clock DIV_WCK under a current generation and outputs the inverted clock. On the other hand, when the inversion division control signal DVD_REVERSE is deactivated to a logic low, the clock dividing unit 320 does not invert the phase of the data division clock DIV_WCK under the current generation and outputs the data division clock DIV_WCK as it is.

That is, the clock dividing unit 320 generates the data division clock DIV_WCK having the same frequency as that of the system clock HCK in response to the data clock WCK, and can change whether it inverts the phase of the generated data division clock DIV_WCK according to the inversion division control signal DVD_REVERSE.

The phase detecting unit 340 detects the phase difference of the data division clock DIV_WCK with respect to the phase of the system clock HCK in the normal training mode NORMAL_WCK2CK MODE corresponding to the activation section of the training operation mode signal NORMAL_WCK2CK.

That is, the phase detecting unit 340 compares whether the data division clock DIV_WCK is in a logic high state or a logic low state at the rising edge of the system clock HCK. When the data division clock DIV_WCK is in the logic high state, the phase detecting unit 340 generates the detection signal DET_SIG which is activated to a logic high. When the data division clock DIV_WCK is in the logic low state, the phase detecting unit 340 generates the detection signal DET_SIG which is deactivated to a logic low.

On the other hand, the phase detecting unit 340 compares whether the data division clock DIV_WCK is in a logic high state or a logic low state at the falling edge of the system clock HCK. When the data division clock DIV_WCK is in the logic high state, the phase detecting unit 340 generates the detection signal DET_SIG which is deactivated to logic low. When the data division clock DIV_WCK is in the logic low state, the phase detecting unit 340 generates the detection signal DET_SIG which is activated to the logic high.

The phase dividing unit 330 can generate eight multiple phase data division clocks MULTI_DIV_WCK_0, MULTI_DIV_WCK_45, MULTI_DIV_WCK_90, MULTI_DIV_WCK_135, MULTI_DIV_WCK_180, MULTI_DIV_WCK_225, MULTI_DIV_WCK_270 and MULTI_DIV_WCK_315 having a 45-degree phase difference, four multiple phase data division clocks MULTI_DIV_WCK_0, MULTI_DIV_WCK_90, MULTI_DIV_WCK_180 and MULTI_DIV_WCK_270 having a 90-degree phase difference, or two multiple phase data division clocks MULTI_DIV_WCK_0 and MULTI_DIV_WCK_180 having a 180-degree phase difference in response to the data division clock DIV_WCK.

Additionally, the number of the multiple phase data division clocks MULTI_DIV_WCK_x which are generated in response to the data division clock DIV_WCK may be varied according to design of a designer. That is, the number of the multiple phase data division clocks MULTI_DIV_WCK_x which are generated according to the data division clock DIV_WCK may be sixteen or thirty-two, in addition to two, four and eight. Moreover, the number of the multiple phase data division clocks MULTI_DIV_WCK_x may be more than thirty-two. An embodiment of the present subject matter will describe a case that it generates the four multiple phase data division clocks MULTI_DIV_WCK_0, MULTI_DIV_WCK_90, MULTI_DIV_WCK_180 and MULTI_DIV_WCK_270 having the 90-degree phase difference according to the data division clock DIV_WCK, below, as an example.

The data serializing unit 350 serializes the parallel pattern data PAT_PARALLEL_DT_1 to PAT_PARALLEL_DT_4 in correspondence with the respective multiple phase data division clocks MULTI_DIV_WCK_0, MULTI_DIV_WCK_90, MULTI_DIV_WCK_180 and MULTI_DIV_WCK_270 which are generated by the phase dividing unit 330 to thereby generate serialized pattern data PAT_SERIAL_DT.

For example, as illustrated in FIG. 3, the phase dividing unit 330 generates the four multiple phase data division clocks MULTI_DIV_WCK_0, MULTI_DIV_WCK_90, MULTI_DIV_WCK_180 and MULTI_DIV_WCK_270 having the 90-degree phase difference according to the data division clock DIV_WCK and outputs the generated clocks to the data serializing unit 350. Simultaneously, the four parallel pattern data PAT_PARALLEL_DT_1 to PAT_PARALLEL_DT_4 to the data serializing unit 350. In this case, the data serializing unit 350 preferentially serializes the first pattern data PAT_PARALLEL_DT_1 according to the first multiple phase data division clock MULTI_DIV_WCK_0, serializes the second pattern data PAT_PARALLEL_DT_2 according to the second multiple phase data division clock MULTI_DIV_WCK_90 succeeding the first multiple phase data division clock MULTI_DIV_WCK_0, serializes the third pattern data PAT_PARALLEL_DT_3 according to the third multiple phase data division clock MULTI_DIV_WCK_180 succeeding the second multiple phase data division clock MULTI_DIV_WCK_90, and serializes the fourth pattern data PAT_PARALLEL_DT_4 according to the fourth multiple phase data division clock MULTI_DIV_WCK_270 succeeding the third multiple phase data division clock MULTI_DIV_WCK_180.

Unlike in FIG. 3, the phase dividing unit 330 generates the eight multiple phase data division clocks MULTI_DIV_WCK_0, MULTI_DIV_WCK_45, MULTI_DIV_WCK_90, MULTI_DIV_WCK_135, MULTI_DIV_WCK_180, MULTI_DIV_WCK_225, MULTI_DIV_WCK_270 and MULTI_DIV_WCK_315 having a 45-degree phase difference according to the data division clock DIV_WCK and outputs the generated clocks to the data serializing unit 350. Simultaneously, the four pattern data PAT_PARALLEL_DT_1 to PAT_PARALLEL_DT_4 are applied in parallel to the data serializing unit 350. In this case, the data serializing unit 350 may serialize the parallel pattern data PAT_PARALLEL_DT_1 to PAT_PARALLEL_DT_4 according to the respective first, third, fifth and seventh multiple phase data division clock MULTI_DIV_WCK_0, MULTI_DIV_WCK_90, MULTI_DIV_WCK_180 and MULTI_DIV_WCK_270. Moreover, the data serializing unit 350 may serialize the parallel pattern data PAT_PARALLEL_DT_1 to PAT_PARALLEL_DT_4 according to the respective second, fourth, sixth and eighth multiple phase data division clock MULTI_DIV_WCK_45, MULTI_DIV_WCK_135, MULTI_DIV_WCK_225 and MULTI_DIV_WCK_315.

At this point, the parallel pattern data PAT_PARALLEL_DT_1 to PAT_PARALLEL_DT_4 may be "0011", "1100", "0101", "1010", "1001", or "0110". Accordingly, the serialized pattern data PAT_SERIAL_DT are "0011", "1100", "0101", "1010", "1001", or "0110" which are respectively synchronized with the multiple phase data division clock MULTI_DIV_WCK_x.

That is, when the parallel pattern data PAT_PARALLEL_DT_1 to PAT_PARALLEL_DT_4 are "0011", the serialized pattern data PAT_SERIAL_DT consists of "0" which is synchronized according to the first multiple phase data division clock MULTI_DIV_WCK_0, "0" which is synchronized according to the second multiple phase data division clock MULTI_DIV_WCK_90 succeeding the first multiple phase data division clock MULTI_DIV_WCK_0, "1" which is synchronized according to the third multiple phase data division clock MULTI_DIV_WCK_180 succeeding the second multiple phase data division clock MULTI_DIV_WCK_90, and "1" which is synchronized according to the fourth multiple phase data division clock MULTI_DIV_WCK_270 succeeding the third multiple phase data division clock MULTI_DIV_WCK_180.

Unlike the disclosure in FIG. 3, the phase dividing unit 330 may generate the eight multiple phase data division clocks MULTI_DIV_WCK_0, MULTI_DIV_WCK_45, MULTI_DIV_WCK_90, MULTI_DIV_WCK_135, MULTI_DIV_WCK_180, MULTI_DIV_WCK_225, MULTI_DIV_WCK_270 and MULTI_DIV_WCK_315 having a 45-degree phase difference according to the data division clock DIV_WCK and outputs the generated clocks to the data serializing unit 350. Simultaneously, eight pattern data PAT_PARALLEL_DT_1 to PAT_PARALLEL_DT_8 are applied to the data serializing unit 350 in parallel. In this case, the data serializing unit 350 preferentially serializes the first pattern data PAT_PARALLEL_DT_1 according to the first multiple phase data division clock MULTI_DIV_WCK_0, serializes the second pattern data PAT_PARALLEL_DT_2 according to the second multiple phase data division clock MULTI_DIV_WCK_45 succeeding the first multiple phase data division clock MULTI_DIV_WCK_0, serializes the third pattern data PAT_PARALLEL_DT_3 according to the third multiple phase data division clock MULTI_DIV_WCK_90 succeeding the second multiple phase data division clock MULTI_DIV_WCK_45, serializes the fourth pattern data PAT_PARALLEL_DT_4 according to the fourth multiple phase data division clock MULTI_DIV_WCK_135 succeeding the third multiple phase data division clock MULTI_DIV_WCK_90, serializes the fifth pattern data PAT_PARALLEL_DT_5 according to the fifth multiple phase data division clock MULTI_DIV_WCK_180 succeeding the fourth multiple phase data division clock MULTI_DIV_WCK_135, serializes the sixth pattern data PAT_PARALLEL_DT_6 according to the sixth multiple phase data division clock MULTI_DIV_WCK_225 succeeding the fifth multiple phase data division clock MULTI_DIV_WCK_180, serializes the seventh pattern data PAT_PARALLEL_DT_7 according to the seventh multiple phase data division clock MULTI_DIV_WCK_270 succeeding the sixth multiple phase data division clock MULTI_DIV_WCK_225, and serializes the eighth pattern data PAT_PARALLEL_DT_8 according to the eighth multiple phase data division clock MULTI_DIV_WCK_315 succeeding the seventh multiple phase data division clock MULTI_DIV_WCK_270.

At this point, the parallel pattern data PAT_PARALLEL_DT_1 to PAT_PARALLEL_DT_8 may be "00001111", "11110000", "00110011", "11001100", "11000011", "00111100", "10101010", or "01010101". Accordingly, the serialized pattern data PAT_SERIAL_DT are "00001111", "11110000", "00110011", "11001100", "11000011", "00111100", "10101010", or "01010101" which are respectively synchronized with the multiple phase data division clock MULTI_DIV_WCK_x.

Additionally, the parallel pattern data PAT_PARALLEL_DT_1 to PAT_PARALLEL_DT_8 may be data having a value which is predefined in the MRS 395. The parallel pattern data PAT_PARALLEL_DT_1 to PAT_PARALLEL_DT_8 may be data which are applied through a predetermined pad from the outside. The parallel pattern data PAT_PARALLEL_DT_1 to PAT_PARALLEL_DT_8 may be data which are applied from a generation circuit included in the semiconductor memory device. That is, the generation path of the parallel pattern data PAT_PARALLEL_DT_1 to PAT_PARALLEL_DT_8 can variously be defined by a designer.

In this way, the serialization scheme of the data serializing unit 350 can be changed according to the number of input multiple phase data division clocks MULTI_DIV_WCK_x and the number of the pattern data PAT_PARALLEL_DT_x which are applied in parallel. However, the serialized pattern data PAT_PARALLEL_DT_x are always synchronized with the multiple phase data division clock, a state of which is unchanged.

The serialized pattern data PAT_SERIAL_DT generated by the data serializing unit 350 and the detection signal DET_SIG generated by the phase detecting unit 340 are selectively transmitted through the signal transmitting unit 360. Accordingly, the external controller controls the clock alignment training operation through an operation of changing the phase of the data clock WCK and an operation of changing the logic level of the inversion division control signal DVD_REVERSE according to the serialized pattern data PAT_SERIAL_DT and the detection signal DET_SIG.

Specifically, the signal selector 362 of the signal transmitting unit 360 outputs the detection signal DET_SIG as the training information signal TRAINING_INFO_SIG in the normal training mode NORMAL_WCK2CK MODE corresponding to the activation section of the training operation mode signal NORMAL_WCK2CK. The signal selector 362 outputs the serialized pattern data PAT_SERIAL_DT, which are applied, as the training information signal TRAINING_INFO_SIG in the auto training mode AUTO_WCK2CK MODE corresponding to the activation section of the auto training operation mode signal AUTO_WCK2CK in a state where the training operation mode signal NORMAL_WCK2CK is activated.

The training information signal transmitter 364 outputs the training information signal TRAINING_INFO_SIG to the external controller irrespective of the normal training mode NORMAL_WCK2CK MDOE corresponding to the activation section of the training operation mode signal NORMAL_WCK2CK and the auto training mode AUTO_WCK2CK MODE corresponding to the activation section of the auto training operation mode signal AUTO_WCK2CK in a state where the training operation mode signal NORMAL_WCK2CK is deactivated.

In this way, in the normal training mode NORMAL_WCK2CK MODE, the external controller receiving the training information signal TRAINING_INFO_SIG performs a control in order for the phase of the data clock WCK to be synchronized with the phase of the system clock HCK through an operation that changes the phase of data clock WCK by a predetermined interval according to the training information signal TRAINING_INFO_SIG. In the auto training mode AUTO_WCK2CK MDOE, the external controller is enabled to determine whether the data division clock DIV_WCK generated by the clock dividing unit 320 is inverted or not through an operation of changing the logic level of the inversion division control signal DVD_REVERSE according to the training information signal TRAINING_INFO_SIG, thereby synchronizing the phase of the data clock WCK with the phase of the system clock HCK.

Specifically, since the training information signal TRAINING_INFO_SIG which is applied to the external controller in the normal training mode NORMAL_WCK2CK MODE is the same as the detection signal DET_SIG output from the phase detecting unit 340, it is a constant logic high signal or a constant logic low signal. That is, when a phase difference between the system clock HCK and the data division clock DIV_WCK is not within a predetermined range, the constant logic high signal is transferred as the training information signal TRAINING_INFO_SIG to the external controller. On the other hand, when a phase difference between the system clock HCK and the data division clock DIV_WCK is within a predetermined range, the constant logic low signal is transferred as the training information signal TRAINING_INFO_SIG to the external controller. Furthermore, when a phase difference between the system clock HCK and the data division clock DIV_WCK is in the boundary of a predetermined range, the training information signal TRAINING_INFO_SIG which alternately has a logic low level or a logic high level may be transferred to the external controller.

In this way, the external controller controls the phase of the data clock WCK in response to the training information signal TRAINING_INFO_SIG. At this point, when the logic level of the training information signal TRAINING_INFO_SIG is a logic high, the external controller changes the phase of the data clock WCK. On the other hand, when the logic level of the training information signal TRAINING_INFO_SIG is a logic low, the external controller does not change the phase of the data clock WCK.

Since the training information signal TRAINING_INFO_SIG which is applied to the external controller in the auto training mode AUTO_WCK2CK MODE is the serialized pattern data PAT_SERIAL_DT output from the data serializing unit 350, it alternately has a logic high level or a logic low level so as to meet a predetermined pattern in synchronization with the data clock WCK. That is, when the serialized pat data PAT_SERIAL_DT is "1100", the training information signal TRAINING_INFO_SIG becomes "11" to thereby have a constant logic high level in the first cycle of the data clock WCK, and the training information signal TRAINING_INFO_SIG becomes "00" to thereby have a constant logic low level in the second cycle of the data clock WCK. Accordingly, the training information signal TRAINING_INFO_SIG, which has a constant logic high level in the first cycle of the data clock WCK and has a constant logic low level in the second cycle of the data clock WCK, is transmitted to the external controller.

Likewise, when the serialized pat data PAT_SERIAL_DT is "0011", the training information signal TRAINING_INFO_SIG becomes "00" to thereby have a constant logic low level in the first cycle of the data clock WCK, and the training information signal TRAINING_INFO_SIG becomes "11" to thereby have a constant logic high level in the second cycle of the data clock WCK. Accordingly, the training information signal TRAINING_INFO_SIG, which has a constant logic low level in the first cycle of the data clock WCK and has a constant logic high level in the second cycle of the data clock WCK, is transmitted to the external controller.

In this way, the external controller changes the logic level of the inversion division control signal DVD_REVERSE in response to the training information signal TRAINING_INFO_SIG. For example, when the serialized pat data PAT_SERIAL_DT becomes "1100" so that it becomes "11" to thereby have a constant logic high level in the first cycle of the data clock WCK and becomes "00" to thereby have a constant logic low level in the second cycle of the data clock WCK, the external controller compares the logic level of the training information signal TRAINING_INFO_SIG with the logic level of the system clock HCK and determines the logic level of the inversion division control signal DVD_REVERSE. That is, in a case that the system clock HCK is logic high in the logic high section of the training information signal TRAINING_INFO_SIG and the system clock HCK is a logic low in the logic low section of the training information signal TRAINING_INFO_SIG, since the phase of the data clock WCK is synchronized with the phase of the system clock HCK, the external controller controls the inversion division control signal DVD_REVERSE to have a logic low level so that the data division clock DIV_WCK generated by the clock dividing unit 320 can be generated in a non-inversion state. On the other hand, in a case where the system clock HCK is a logic low in the logic high section of the training information signal TRAINING_INFO_SIG and the system clock HCK is logic high in the logic low section of the training information signal TRAINING_INFO_SIG, since the phase of the data clock WCK is not synchronized with the phase of the system clock HCK whereas it is in inversion with the phase of the system clock HCK, the external controller controls the inversion division control signal DVD_REVERSE to have a logic high level so that the data division clock DIV_WCK generated by the clock dividing unit 320 can be generated in an inversion state.

The reset unit 370 generates the reset signal RESET for resetting the data inputting/outputting unit 380 according to a result of the clock alignment training operation. That is, in the normal training mode NORMAL_WCK2CK MODE corresponding to the activation section of the training operation mode signal NORMAL_WCK2CK, the reset unit 370 defines the activation section of the reset signal RESET and generates the reset signal RESET in response to the training operation mode signal NORMAL_WCK2CK. In the auto training mode AUTO_WCK2CK MODE corresponding to the activation section of the auto training operation mode signal AUTO_WCK2CK in a state where the training operation mode signal NORMAL_WCK2CK is deactivated, the reset unit 370 defines the activation section of the reset signal RESET and generates the reset signal RESET in response to the inversion division control signal DVD_REVERSE.

Specifically, since the phase of the data clock WCK is not yet synchronized with the phase of the system clock HCK under clock alignment training operation and the phase of the data clock WCK can frequently be changed under clock alignment training operation, the data inputting/outputting unit 380 does not output the internal data IN_DATA or receive the external data OUT_DATA for its accurate operation.

Since the phase of the data clock WCK is no longer changed and becomes constant after the completion time of the clock alignment training operation, the data inputting/outputting unit 380 outputs the internal data IN_DATA or receives the external data OUT_DATA after the completion time of the clock alignment training operation.

However, although the phase of the data clock WCK is in a changed state due to the occurrence of the clock alignment training operation, the data inputting/outputting unit 380 maintains a state where it has operated in response to the data clock WCK before the phase change of the data clock WCK. Therefore, it is necessary to initialize the data inputting/outputting unit 380 at the completion time of the clock alignment training operation for preventing the malfunction of the data inputting/outputting unit 380.

That is, it is necessary that the data inputting/outputting unit 380 newly outputs the internal data IN_DATA or receives the external data OUT_DATA according to the data clock WCK having a phase changed by the clock alignment training operation.

To operate the data inputting/outputting unit 380 in the normal training mode NORMAL_WCK2CK MODE as described above, the reset signal RESET is activated according to the activation of the training operation mode signal NORMAL_WCK2CK informing the entry of the normal training mode NORMAL_WCK2CK MODE, and the reset signal RESET is deactivated according to the deactivation of the training operation mode signal NORMAL_WCK2CK informing the exit of the normal training mode NORMAL_WCK2CK MODE.

Consequently, in the normal training mode NORMAL_WCK2CK MODE, the data inputting/outputting unit 380 can continuously maintain an initialization state in the operation section where the phase of the data clock WCK is changed, and can get out of the initialization state when the operation section is completed so that the phase of the data clock WCK is no longer changed. Accordingly, the data inputting/outputting unit 380 outputs the internal data IN_DATA or receives the external data OUT_DATA in a state where the phase of the data clock WCK is no longer changed.

Additionally, in spite of irrelevance of the fact that the reset signal is momentarily activated at a time when the operation of the normal training mode NORMAL_WCK2CK MODE is completed, the reset signal RESET is continuously activated in the operation section of the normal training mode NORMAL_WCK2CK MODE. This is for preventing the data clock WCK having a frequently changed phase from having influence on the data inputting/outputting unit 380 such that the data inputting/outputting unit 380 malfunctions, in the operation section of the normal training mode NORMAL_WCK2CK MODE.

To operate the data inputting/outputting unit 380 in the auto training mode AUTO_WCK2CK MODE as described above, the reset signal RESET is activated during a certain time according to the shift of the logic level of the inversion division control signal DVD_REVERSE informing the exit of the auto training mode AUTO_WCK2CK MODE.

Consequently, in the auto training mode AUTO_WCK2CK MODE, the data clock WCK having a changed phase can have influence on the operation of the data inputting/outputting unit 380 by initializing the data inputting/outputting unit 380 when the phase of the data clock WCK is inverted according to an operation result, and the data inputting/outputting unit 380 is not initialized when the phase of the data clock WCK is not inverted according to an operation result. Therefore, the data inputting/outputting unit 380 always outputs the internal data IN_DATA or receives the external data OUT_DATA in a state where the phase of the data clock WCK is no longer changed.

At this point, the data inputting/outputting unit 380 is initialized only when the logic level of the inversion division control signal DVD_REVERSE is shifted in the auto training mode AUTO_WCK2CK MODE. This is because there is only an operation that controls whether the phase of the data clock WCK is inverted or not, since the logic level of the inversion division control signal DVD_REVERSE is changed when the phase of the data clock WCK is changed according to the operation result of the auto training mode AUTO_WCK2CK MODE. That is, if the logic level of the inversion division control signal DVD_REVERSE is changed at a time when the operation of the auto training mode AUTO_WCK2CK MODE is completed, which means that the phase of the data clock WCK is inverted, it is necessary to initialize the data inputting/outputting unit 380. However, if the logic level of the inversion division control signal DVD_REVERSE is not changed at a time when the operation of the auto training mode AUTO_WCK2CK MODE is completed, which means that the phase of the data clock WCK is not changed, it is unnecessary to initialize the data inputting/outputting unit 380.

To satisfy the operation of the reset unit 370, the reset signal generator 376 is required, which determines whether the reset signal RESET used in the normal training mode NORMAL_WCK2CK MODE is generated or the reset signal used in the auto training mode AUTO_WCK2CK MODE is generated, in the reset unit 370.

In the normal training mode NORMAL_WCK2CK MODE, since the reset signal RESET must be generated according to the logic level of the training operation mode signal NORMAL_WCK2CK, the reset signal generator 376 receives the training operation mode signal NORMAL_WCK2CK from the mode controlling unit 390 and generates the reset signal RESET.

Since the reset signal RESET must be generated according to the shift of the logic level of the inversion division control signal DVD_REVERSE in the auto training mode AUTO_WCK2CK MODE, the reset unit 370 may further include the pulse generator 372 generating the inversion division control pulse DVD_REVERSE_PUL which is activated during a predetermined time according to the shift of the logic level of the inversion division control signal DVD_REVERSE, and the delay synchronizer 374 synchronizing the inversion division control pulse DVD_REVERSE_PUL with the system clock HCK. Furthermore, the reset unit 370 generates the reset signal RESET according to the pulse DLY_DVD_REVERSE_PUL output from the delay synchronizer 374.

Figure 4:
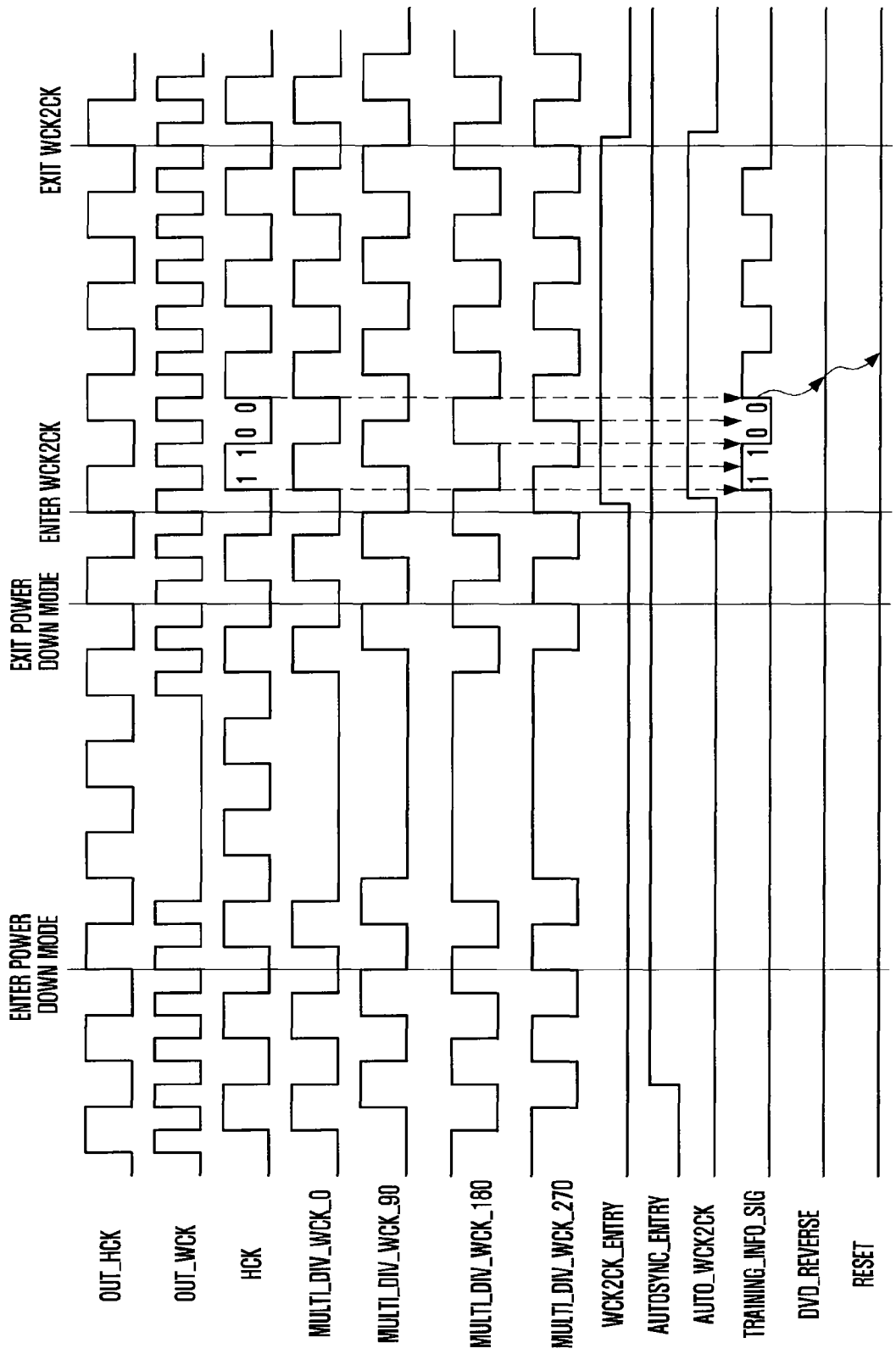
FIG. 4 is a timing diagram showing the non-inversion operation of the circuit of FIG. 3 performing the clock alignment training in accordance with the embodiment of the present subject matter.

FIG. 4 is a timing diagram for describing the non-inversion operation of the circuit for performing the clock alignment training in accordance with an embodiment of the present invention of FIG. 3.

Referring to FIG. 4, in the non-inversion operation of the circuit for performing the clock alignment training in accordance with an embodiment of the present invention, the phase of the data division clock DIV_WCK is synchronized with the phase of the system clock HCK even after exiting from the power down mode which has been entered. Accordingly, the division control signal DVD_REVERSE is deactivated to logic low from the start to the end.

Additionally, although the data clock WCK and the data division clock DIV_WCK are not directly illustrated in FIG. 4, the first multiple phase data division clock MULTI_DIV_WCK_0 of the multiple phase data division clocks MULTI_DIV_WCK_0, MULTI_DIV_WCK_90, MULTI_DIV_WCK_180 and MULTI_DIV_WCK_270 has the same phase as that of the data division clock DIV_WCK. Moreover, the frequency of the data division clock DIV_WCK is different from that of the data clock WCK, but the data division clock DIV_WCK and the data clock WCK have the same phase.

Specifically, the auto sync operation entry signal AUTO-SYNC_ENTRY is preferentially activated to a logic high before the entry of the power down mode. This means that the normal training mode NORMAL_WCK2CK MODE is completed before the entry of the power down mode so that the data clock WCK and the data division clock DIV_WCK are synchronized with the system clock HCK.

Accordingly, when a clock alignment training operation entry signal WCK2CK_ENTRY is activated after exiting from the power down mode and the clock alignment training operation is entered, the auto training operation signal AUTO_WCK2CK is activated without condition so that the auto training mode AUTO_WCK2CK MODE is entered. At this point, only the clock alignment training operation entry signal WCK2CK_ENTRY is illustrated and a clock alignment training operation exit signal WCK2CK_EXIT is not illustrated, which means that the clock alignment training operation entry signal WCK2CK_ENTRY is contrary to the clock alignment training operation exit signal WCK2CK_EXIT.

When the auto training operation signal AUTO_WCK2CK is activated so that the auto training mode AUTO_WCK2CK MODE is entered, the serialization pattern data PAT_SERIAL_DT output from the data serializing unit 350 is outputted as the training information signal TRAINING_INFO_SIG. That is, the training information signal TRAINING_INFO_SIG is outputted in synchronization with the first multiple phase data division clock MULTI_DIV_WCK_0 which is the same clock as the data division clock DIV_WCK.

At this point, it can be seen that the first multiple phase data division clock MULTI_DIV_WCK_0 is synchronized with the system clock HCK. Moreover, since the first multiple phase data division clock MULTI_DIV_WCK_0 and the training information signal TRAINING_INFO_SIG are synchronized with each other, it can be seen that the training information signal TRAINING_INFO_SIG is synchronized with the system clock HCK.

That is, in the logic high section of the system clock HCK, the serialization pattern data PAT_SERIAL_DT output from the data serializing unit 350 becomes "11" so that the training information signal TRAINING_INFO_SIG becomes logic high. In the logic low section of the system clock HCK, the serialization pattern data PAT_SERIAL_DT output from the data serializing unit 350 becomes "00" so that the training information signal TRAINING_INFO_SIG becomes logic low.

Accordingly, the external controller does not change the logic level of the inversion division control signal DVD_REVERSE of a logic low state, thereby maintaining a synchronization state where the first multiple phase data division clock MULTI_DIV_WCK_0 which is the same clock as the data division clock DIV_WCK is synchronized with the system clock HCK as it is.

Moreover, since the logic level of the inversion division control signal DVD_REVERSE is not changed, it can be seen that the reset signal RESET is not activated and continuously maintains a logic low level.

Figure 5:
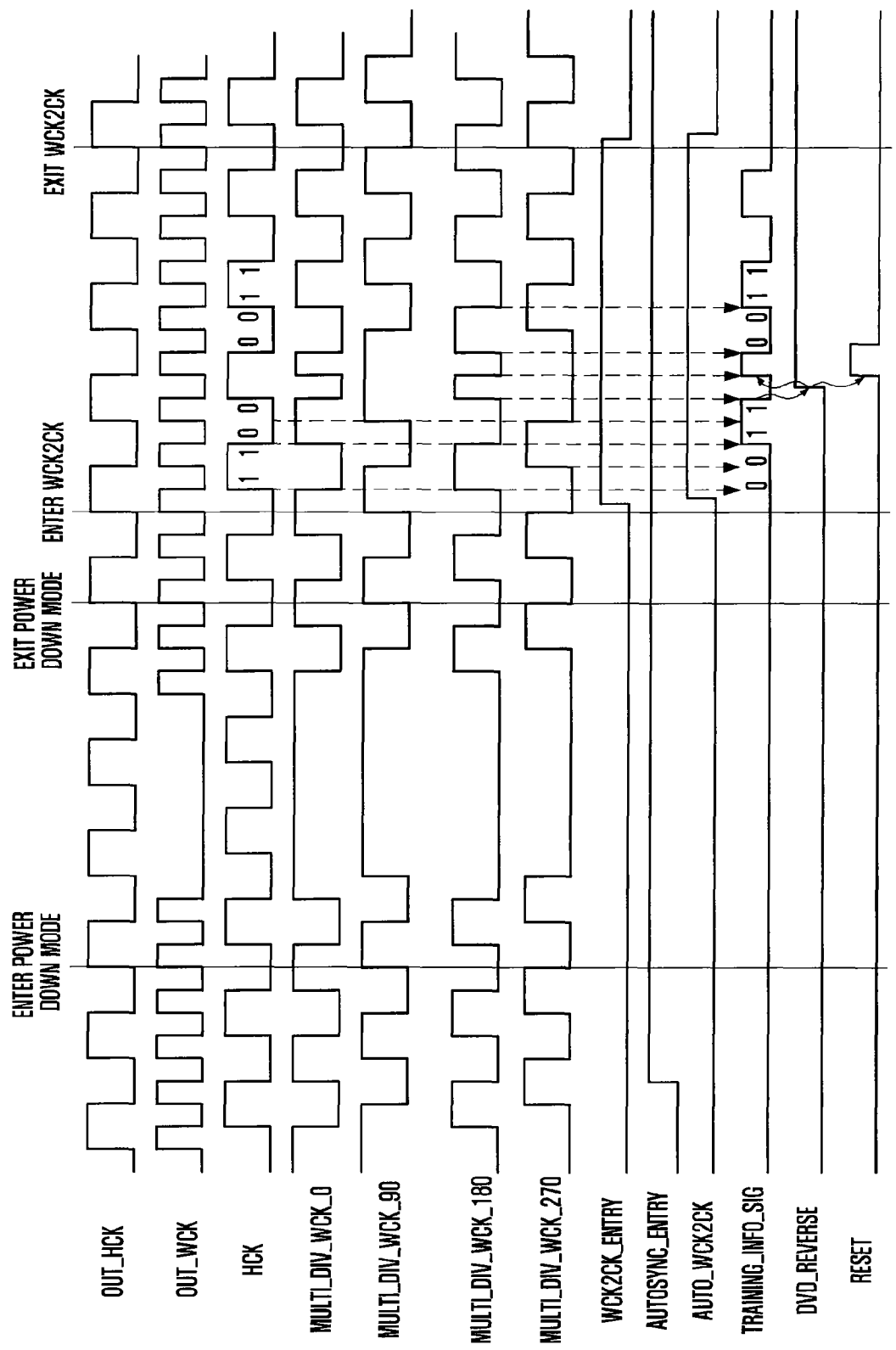
FIG. 5 is a timing diagram showing the inversion operation of the circuit of FIG. 3 performing the clock alignment training in accordance with an embodiment of the present subject matter.

FIG. 5 is a timing diagram showing the inversion operation of the circuit for performing the clock alignment training in accordance with an embodiment of the present subject matter of FIG. 3.

Referring to FIG. 5, in the inversion operation of the circuit for performing the clock alignment training in accordance with an embodiment of the present subject matter, the phase of the data division clock DIV_WCK is not synchronized with the phase of the system clock HCK even after exiting from the power down mode which has been entered. Accordingly, the division control signal DVD_REVERSE is deactivated to a logic low at first, and then it inverts the phase of the data division clock DIV_WCK while being activated to a logic high later.

Additionally, although the data clock WCK and the data division clock DIV_WCK are not directly illustrated in FIG. 5, the first multiple phase data division clock MULTI_DIV_WCK_0 of the multiple phase data division clocks MULTI_DIV_WCK_0, MULTI_DIV_WCK_90, MULTI_DIV_WCK_180 and MULTI_DIV_WCK_270 has the same phase as that of the data division clock DIV_WCK. Moreover, the frequency of the data division clock DIV_WCK is different from that of the data clock WCK, but the data division clock DIV_WCK and the data clock WCK have the same phase.

Specifically, the auto sync operation entry signal AUTO_SYNC_ENTRY is preferentially activated to a logic high before the entry of the power down mode. This means that the normal training mode NORMAL_WCK2CK MODE is completed before the entry of the power down mode such that the data clock WCK and the data division clock DIV_WCK are synchronized with the system clock HCK.

Accordingly, when the clock alignment training operation entry signal WCK2CK_ENTRY is activated after exiting from the power down mode and the clock alignment training operation is entered, the auto training operation signal AUTO_WCK2CK is activated without condition such that the auto training mode AUTO_WCK2CK MODE is entered. At this point, only the clock alignment training operation entry signal WCK2CK_ENTRY is illustrated and the clock alignment training operation exit signal WCK2CK_EXIT is not illustrated, which means that the clock alignment training operation entry signal WCK2CK_ENTRY is contrary to the clock alignment training operation exit signal WCK2CK_EXIT.

When the auto training operation signal AUTO_WCK2CK is activated so that the auto training mode AUTO_WCK2CK MODE is entered, the serialization pattern data PAT_SERIAL_DT output from the data serializing unit 350 is outputted as the training information signal TRAINING_INFO_SIG. That is, the training information signal TRAINING_INFO_SIG is outputted in synchronization with the first multiple phase data division clock MULTI_DIV_WCK_0 which is the same clock as the data division clock DIV_WCK.

At this point, it can be seen that the first multiple phase data division clock MULTI_DIV_WCK_0 is not synchronized with the system clock HCK. Moreover, since the first multiple phase data division clock MULTI_DIV_WCK_0 and the training information signal TRAINING_INFO_SIG are synchronized with each other, the training information signal TRAINING_INFO_SIG is not synchronized with the system clock HCK.

That is, in the logic high section of the system clock HCK, the serialization pattern data PAT_SERIAL_DT output from the data serializing unit 350 becomes "00" so that the training information signal TRAINING_INFO_SIG becomes a logic low. In the logic low section of the system clock HCK, the serialization pattern data PAT_SERIAL_DT output from the data serializing unit 350 becomes "11" so that the training information signal TRAINING_INFO_SIG becomes a logic high.

Accordingly, the external controller changes the logic level of the inversion division control signal DVD_REVERSE from a logic low level to a logic high level, and, consequently, the phase of the first multiple phase data division clock MULTI_DIV_WCK_0 which is the same clock as the data division clock DIV_WCK is inverted. The phase of the first multiple phase data division clock MULTI_DIV_WCK_0 is synchronized with the phase of the system clock HCK after the phase inversion of the first multiple phase data division clock MULTI_DIV_WCK_0.

Moreover, since the auto training mode AUTO_WCK2CK MODE is not completed even after the phase inversion of the first multiple phase data division clock MULTI_DIV_WCK_0, the serialization pattern data PAT_SERIAL_DT output from the data serializing unit 350 is outputted as the training information signal TRAINING_INFO_SIG. At this point, since the phase of the first multiple phase data division clock MULTI_DIV_WCK_0 is inverted, it can be seen that a value of the training information signal TRAINING_INFO_SIG is changed.

That is, in the logic high section of the system clock HCK, the serialization pattern data PAT_SERIAL_DT output from the data serializing unit 350 was "00", but it is changed into "11" so that the logic level of the training information signal TRAINING_INFO_SIG is changed from a logic low level to a logic high level. In the logic low section of the system clock HCK, the serialization pattern data PAT_SERIAL_DT output from the data serializing unit 350 was "11", but it is changed into "00" so that the logic level of the training information signal TRAINING_INFO_SIG is changed from a logic high level to a logic low level.

Moreover, since the logic level of the inversion division control signal DVD_REVERSE is changed from a logic low level to a logic high level, it can be seen that the reset signal RESET is also activated during a predetermined time according to the change of the inversion division control signal DVD_REVERSE.

As described above, the semiconductor memory device in accordance with an embodiment of the present subject matter synchronizes the predetermined pattern data which are synchronized with the data clock WCK to multiple phases and outputs the synchronized pattern data upon clock alignment training operation, and enables the external controller to determine a phase difference between the system clock HCK and the data clock WCK through the synchronization of the pattern data, thereby optionally inverting the data clock WCK according to a result of the determination. Accordingly, the semiconductor memory device can synchronize the phase of the data clock WCK with the phase of the system clock HCK at very high speed.

Moreover, in the structure and operation waveforms of an embodiment of the present subject matter illustrate in FIGS. 3 to 5, an operation, which synchronizes the predetermined pattern data which are synchronized with the data clock WCK to multiple phases and outputs the synchronized pattern data, is applied in the entry/exit operation of an operation mode, such as the power down mode, which is entered in a state where the phase of the data clock WCK has already been synchronized with the phase of the system clock HCK through the normal clock alignment training operation.

However, a semiconductor memory device, which receives the data clock WCK and the system clock HCK having a relatively slow frequency and operates, does not include elements for performing the normal clock alignment training operation, e.g., the phase detection unit 340 and signal selector 362 of FIG. 3, but includes the essential elements of an embodiment of the present subject matter, e.g., the clock dividing unit 320, phase dividing unit 330 and data serializing unit 350 of FIG. 3. In this case, the semiconductor memory device can perform a main operation that synchronizes the predetermined pattern data which are synchronized with the data clock WCK to multiple phases, outputs the synchronized pattern data, and synchronizes the phase of the data clock WCK with the phase of the system clock HCK through an operation that enables the data clock WCK to optionally be inverted according to the synchronization of the pattern data.

That is, in the above-described embodiment of the present subject matter, the clock alignment training operation is divided into the normal clock alignment training operation and the auto clock alignment training operation. Herein, the auto clock alignment training operation is performed only after the normal clock alignment training operation is completed. However, the semiconductor memory device, which receives the data clock WCK and the system clock HCK having a relatively slow frequency and operates, omits the normal clock alignment training operation, and can synchronize the phase of the data clock WCK with the phase of the system clock HCK by performing only the auto training operation.

Embodiments of the present subject matter determine a phase difference between a system clock HCK and a data clock WCK using predetermined pattern data which are synchronized with the data clock WCK to multiple phases upon clock alignment training operation, and selectively invert the phase of the data clock WCK according to a result of the determination, thereby synchronizing the phase of the data clock WCK with the phase of the system clock HCK at very high speed.

While the present invention has been described with respect to the specific embodiments, it will be apparent to those skilled in the art that various changes and modifications may be made without departing from the spirit and scope of the invention as defined in the following claims. For example, the above-described embodiments include only one data input/output pad, but may include two or more data input/output pads.

What is claimed is:

1. A semiconductor memory device, comprising:
    a clock inputting unit configured to receive a system clock and a data clock;
    a clock dividing unit configured to divide a frequency of the data clock to generate a data division clock, wherein the clock dividing unit determines a phase of the data division clock in response to an inversion division control signal;
    a phase dividing unit configured to generate a plurality of multiple phase data division clocks having respective predetermined phase differences with each other in response to the data division clock;
    a data serializing unit configured to serialize predetermined parallel pattern data in correspondence with the multiple phase data division clocks; and
    a signal transmitting unit configured to transmit an output signal of the data serializing unit to the outside.

2. The semiconductor memory device of claim 1, further comprising:
    a data inputting/outputting unit configured to output internal data to the outside or receive external data in response to the data clock; and
    a reset unit configured to reset the data inputting/outputting unit in response to the inversion division control signal.

3. The semiconductor memory device of claim 1, wherein the clock inputting unit comprises:
    a system clock generator configured to receive a first external clock for synchronizing an input time of an address signal and an input time of a command signal, and output the received first external clock as the system clock; and
    a data clock generator configured to receive a second external clock for synchronizing an input time of a data signal, and output the received second external clock as the data clock.

4. The semiconductor memory device of claim 1, wherein the clock dividing unit optionally inverts a phase of the data division clock in response to the inversion division control signal.

5. The semiconductor memory device of claim 1, wherein the phase dividing unit generates the multiple phase data division clocks having a 45-degree or 90-degree phase difference with each other in response to the data division clock.

6. The semiconductor memory device of claim 5, wherein the predetermined pattern data is "0011", "1100", "0101", "1010", "1001", or "0110".

7. The semiconductor memory device of claim 5, wherein the predetermined pattern data is "00001111", "11110000", "00110011", "11001100", "11000011", "00111100", "10101010", or "01010101".

8. The semiconductor memory device of claim 2, wherein the reset unit comprises:
    a pulse generator configured to generate a division control pulse toggled at a shift time of a logic level of the inversion division control signal; and
    a delay synchronizer configured to delay the division control pulse by a predetermined time and outputs the delayed division control pulse as a reset signal, wherein the delay synchronizer synchronizes an output time of the reset signal with the system clock.

9. The semiconductor memory device of claim 1, wherein a logic level of the inversion division control signal is changed in response to the output signal of the data serializing unit which is transmitted to the outside by the signal transmitting unit.

10. A semiconductor memory device, comprising:
    a clock inputting unit configured to receive a system clock and a data clock;
    a clock dividing unit configured to divide a frequency of the data clock to generate a data division clock, wherein the clock dividing unit determines a phase of the data division clock in response to an inversion division control signal;
    a phase detecting unit configured to detect a phase difference between the data division clock and the system clock, and generate a detection signal corresponding to a result of the detection;
    a phase dividing unit configured to generate a plurality of multiple phase data division clocks having respective predetermined phase differences with each other in response to the data division clock;

a data serializing unit configured to serialize predetermined parallel pattern data in correspondence with the multiple phase data division clocks; and a signal transmitting unit configured to selectively transmit an output signal of the data serializing unit or the detection signal to the outside in response to a training operation mode signal.

11. The semiconductor memory device of claim 10, further comprising:

a data inputting/outputting unit configured to output internal data to the outside or receive external data in response to the data clock; and a reset unit configured to reset the data inputting/outputting unit in response to the inversion division control signal or the training operation mode signal.

12. The semiconductor memory device of claim 10, wherein the clock inputting unit comprises:

a system clock generator configured to receive a first external clock for synchronizing an input time of an address signal and an input time of a command signal, and output the received first external clock as the system clock; and a data clock generator configured to receive a second external clock for synchronizing an input time of a data signal, and output the received second external clock as the data clock.

13. The semiconductor memory device of claim 10, wherein the clock dividing unit optionally inverts a phase of the data division clock in response to the inversion division control signal.

14. The semiconductor memory device of claim 10, wherein the phase dividing unit generates the multiple phase data division clocks having a 45-degree or 90-degree phase difference with each other in response to the data division clock.

15. The semiconductor memory device of claim 14, wherein the predetermined pattern data is "0011", "1100", "0101", "1010", "1001", or "0110".

16. The semiconductor memory device of claim 14, wherein the predetermined pattern data is "00001111", "11110000", "00110011", "11001100", "11000011", "001111000", "10101010", or "01010101".

17. The semiconductor memory device of claim 10, wherein the signal transmitting unit comprises:

a signal selector configured to output any one of the output signal of the data serializing unit and the detection signal as a training information signal in response to the training operation mode signal; and a training information signal transmitter configured to transmit the training information signal to the outside.

18. The semiconductor memory device of claim 17, wherein the signal selector outputs the detection signal as the training information signal in an activation section of the training operation mode signal, and outputs the output signal of the data serializing unit as the training information signal in a deactivation section of the training operation mode signal.

19. The semiconductor memory device of claim 11, wherein the reset unit comprises:

a pulse generator configured to generate a division control pulse toggled at a shift time of a logic level of the inversion division control signal;

a delay synchronizer configured to delay the division control pulse by a predetermined time and outputs the delayed division control pulse, wherein the delay synchronizer synchronizes the delayed division control pulse with the system clock; and a reset signal generator configured to generate a reset signal in response to the training operation mode signal or an output pulse of the delay synchronizer.

20. The semiconductor memory device of claim 19, wherein the reset signal generator activates the reset signal in the activation section of the training operation mode signal, and activates the reset signal in response to the output pulse of the delay synchronizer in the deactivation section of the training operation mode signal.

21. The semiconductor memory device of claim 10, wherein a logic level of the inversion division control signal is changed in response to the output signal of the data serializing unit which is transmitted to the outside by the signal transmitting unit.

22. An operation method of a semiconductor memory device, the operation method comprising:

receiving a system clock and a data clock;

dividing a frequency of the data clock to generate a data division clock, wherein a phase of the data division clock is determined in response to an inversion division control signal;

sensing an entry of a normal training mode or an entry of an auto training mode;

generating a plurality of multiple phase data division clocks having respective predetermined phase differences with each other in response to the data division clock when the auto training mode is entered as a result of the sense;

serializing predetermined parallel pattern data in correspondence with the respective multiple phase data division clocks; and transmitting the serialized pattern data to the outside.

23. The operation method of claim 22, further comprising:

outputting internal data to the outside or receiving external data in response to the data clock, wherein a phase of the data clock is initialized at an exit time of the normal training mode; and outputting the external data to the outside or receiving the internal data in response to the data clock, wherein the phase of the data clock is initialized at a time when the inversion division control signal is shifted in an operation section of the auto training mode.

24. The operation method of claim 22, wherein the receiving of the system clock and the data clock comprises:

receiving a first external clock for synchronizing an input time of an address signal and an input time of a command signal, and output the received first external clock as the system clock; and receiving a second external clock for synchronizing an input time of a data signal, and outputting the received second external clock as the data clock.

25. The operation method of claim 22, wherein the generating of the data division clock comprises:

dividing a frequency of the data clock to generate the data division clock irrespective of the inversion division control signal in the normal training mode;

inverting a phase of the data division clock to generate the data division clock according to an activation of the inversion division control signal in the auto training mode; and generating the data division clock without inverting the phase of the data division clock according to a deactivation of the inversion division control signal in the auto training mode.

26. The operation method of claim 22, wherein the generating of a plurality of multiple phase data division clocks having respective predetermined phase differences comprises:

generating the multiple phase data division clocks having a 45-degree or 90-degree phase difference with each other in response to the data division clock.

27. The operation method of claim 26, wherein the predetermined pattern data is "0011", "1100", "0101", "1010", "1001", or "0110".

28. The operation method of claim 26, wherein the predetermined pattern data is "00001111", "11110000", "00110011", "11001100", "11000011", "001111000", "10101010", or "01010101".

29. The operation method of claim 23, wherein the outputting of the internal data or the receiving of the external data comprises:

generating a division control pulse toggled at a shift time of a logic level of the inversion division control signal;

delaying the division control pulse by a predetermined time to output the delayed division control pulse as a delay division control pulse, wherein the delay division control pulse is outputted in synchronization with the system clock; and initializing a phase of the data clock at a toggling time of the delay division control pulse in an operation section of the auto training mode, and outputting the internal data to the outside or receiving the external data according to the initialized data clock.

30. The operation method of claim 22, wherein a logic level of the inversion division control signal is changed according to a value of the serialized pattern data transmitted to the outside.

31. The operation method of claim 22, further comprising:

detecting a phase difference between the data division clock and the system clock when the normal training mode is entered as the result of the sense, and determining a logic level of a training information signal according to a result of the detection; and transmitting the training information signal to the outside.

32. The operation method of claim 31, wherein a phase of the data clock is changed according to a value of the training information signal transmitted to the outside.

* * * * *